US010269671B2

(12) United States Patent
Hsu et al.

(10) Patent No.: US 10,269,671 B2
(45) Date of Patent: Apr. 23, 2019

(54) PACKAGE STRUCTURE AND MANUFACTURING METHOD THEREOF

(71) Applicant: Powertech Technology Inc., Hsinchu County (TW)

(72) Inventors: Hung-Hsin Hsu, Hsinchu County (TW); Nan-Chun Lin, Hsinchu County (TW)

(73) Assignee: Powertech Technology Inc., Hinshu County (TW)

( * ) Notice: Subject to any disclaimer, the term of this patent is extended or adjusted under 35 U.S.C. 154(b) by 0 days.

(21) Appl. No.: 15/647,206

(22) Filed: Jul. 11, 2017

(65) Prior Publication Data
US 2018/0190558 A1    Jul. 5, 2018

Related U.S. Application Data
(60) Provisional application No. 62/441,926, filed on Jan. 3, 2017.

(51) Int. Cl.
*H01L 23/31* (2006.01)
*H01L 23/00* (2006.01)
(Continued)

(52) U.S. Cl.
CPC ...... *H01L 23/3114* (2013.01); *H01L 23/3128* (2013.01); *H01L 23/49816* (2013.01);
(Continued)

(58) Field of Classification Search
CPC . H01L 23/3114; H01L 23/3128; H01L 24/73; H01L 24/04; H01L 24/13;
(Continued)

(56) References Cited

U.S. PATENT DOCUMENTS 9,611,143 B2    4/2017  Ho et al.
2003/0209806 A1*  11/2003  Akagawa ............ H01L 23/3121
                                                         257/758
(Continued)

FOREIGN PATENT DOCUMENTS

CN     205384626    7/2016
TW     201703220    1/2017

OTHER PUBLICATIONS

"Office Action of Taiwan Counterpart Application", dated Mar. 6, 2018, p. 1-p. 7.

*Primary Examiner* — Syed I Gheyas
(74) *Attorney, Agent, or Firm* — JCIPRNET

(57) ABSTRACT

A manufacturing method of a package structure includes at least the following steps. A plurality of conductive connectors are formed on a circuit layer. The circuit layer includes a central region and a peripheral region electrically connected to the central region. A chip is disposed on the central region of the circuit layer. The chip includes an active surface at a distance from the circuit layer and a sensing area on the active surface. An encapsulant is formed on the circuit layer to encapsulate the chip and the conductive connectors. A redistribution layer is formed on the encapsulant to electrically connect the chip and the conductive connectors. The redistribution layer partially covers the chip and includes a window corresponding to the sensing area of the chip. A package structure is also provided.

20 Claims, 12 Drawing Sheets

40

(51) Int. Cl.
*H01L 23/498* (2006.01)
*H01L 23/538* (2006.01)
*H01L 27/146* (2006.01)
*H01L 21/56* (2006.01)

(52) U.S. Cl.
CPC .......... *H01L 23/5389* (2013.01); *H01L 24/04* (2013.01); *H01L 24/13* (2013.01); *H01L 24/19* (2013.01); *H01L 24/25* (2013.01); *H01L 24/73* (2013.01); *H01L 21/568* (2013.01); *H01L 27/14678* (2013.01); *H01L 2224/02379* (2013.01); *H01L 2224/0401* (2013.01); *H01L 2224/04105* (2013.01); *H01L 2224/12105* (2013.01); *H01L 2224/13024* (2013.01); *H01L 2224/25171* (2013.01); *H01L 2224/73209* (2013.01); *H01L 2224/73259* (2013.01); *H01L 2224/73267* (2013.01)

(58) Field of Classification Search
CPC ..................... H01L 24/25; H01L 24/19; H01L 2224/12105; H01L 27/14678; H01L 2224/25171; H01L 2224/73259; H01L 2224/73209; H01L 2224/02379; H01L 2224/04105; H01L 2224/0401
See application file for complete search history.

(56) References Cited

U.S. PATENT DOCUMENTS

| | | |
|---|---|---|
| 2012/0286400 A1 | 11/2012 | Camacho et al. |
| 2013/0200528 A1 | 8/2013 | Lin et al. |
| 2013/0221452 A1* | 8/2013 | Strothmann ............ H01L 24/20 257/414 |
| 2014/0138788 A1* | 5/2014 | Kim .................. H01L 27/14618 257/433 |
| 2015/0262984 A1 | 9/2015 | Krabe et al. |
| 2016/0064334 A1* | 3/2016 | Bishop .................. H01L 23/544 438/15 |

* cited by examiner

PACKAGE STRUCTURE AND MANUFACTURING METHOD THEREOF

CROSS-REFERENCE TO RELATED APPLICATION

This application claims the priority benefit of U.S. provisional application Ser. No. 62/441,926, filed on Jan. 3, 2017. The entirety of the above-mentioned patent application is hereby incorporated by reference herein and made a part of specification.

BACKGROUND OF THE INVENTION

1. Field of the Invention

The present invention generally relates to a package structure and a manufacturing method thereof, and more particularly, to a package structure and a manufacturing method having a sensing area on a chip.

2. Description of Related Art

In recently years, electronic apparatus are more important for human's life. For security consideration, a finger printer identification scheme is used in electronic apparatus in nowadays. Moreover, in order for electronic apparatus design to achieve being light, slim, short, and small, semiconductor packaging technology has kept progressing, in attempt to develop products that are smaller in volume, lighter in weight, higher in integration, and more competitive in market. As such, miniaturizing the package structure with improved sensing capabilities of finger printer detection has become a challenge to researchers in the field.

SUMMARY OF THE INVENTION

The disclosure provides a package structure and a manufacturing method thereof, which reduces the size of the package structure with improved sensing capabilities.

The disclosure provides a manufacturing method of a package structure. The method includes at least the following steps. A plurality of conductive connectors are formed on a circuit layer. The circuit layer includes a central region and a peripheral region electrically connected to the central region. A chip is disposed on the central region of the circuit layer. The chip includes an active surface at a distance from the circuit layer and a sensing area on the active surface. An encapsulant is formed on the circuit layer to encapsulate the chip and the conductive connectors. A redistribution layer is formed on the encapsulant to electrically connect the chip and the conductive connectors. The redistribution layer partially covers the chip and includes a window corresponding to the sensing area of the chip.

The disclosure provides a manufacturing method of a package structure. The method includes at least the following steps. A chip is encapsulated by an encapsulant. The chip includes an active surface exposed by the encapsulant and a sensing area on the active surface. A first redistribution layer is formed on the encapsulant to electrically connect the active surface of the chip. The first redistribution layer includes a window corresponding to the sensing area of the chip. A plurality of vias are formed on the encapsulant to expose at least a portion of the first redistribution layer. A plurality of conductive structures are formed on the encapsulant. The conductive structures are electrically connected to the first redistribution layer.

The disclosure provides a package structure including a chip, a redistribution layer, a plurality of conductive connectors and an encapsulant. The chip includes an active surface and a sensing area disposed on the active surface. The redistribution layer is disposed on the chip and electrically connected to the chip. The redistribution layer partially covers the chip and includes a window corresponding to the sensing area of the chip. The conductive connectors surround the chip and are electrically connected to the redistribution layer. The encapsulant encapsulates the chip and the conductive connectors.

Based on the above, the chip is disposed between the circuit layer and the first redistribution layer and the conductive connectors are electrically connected therebetween. As a result, a thickness of the package structure may be reduced, thereby achieving miniaturization in the package structure. Moreover, the sensing area on the active surface of the chip is corresponding to the window of the circuit layer. Therefore, the distance between the top surface of the package structure and the sensing area of the chip is reduced to achieve an improved sensing capability of the package structure.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
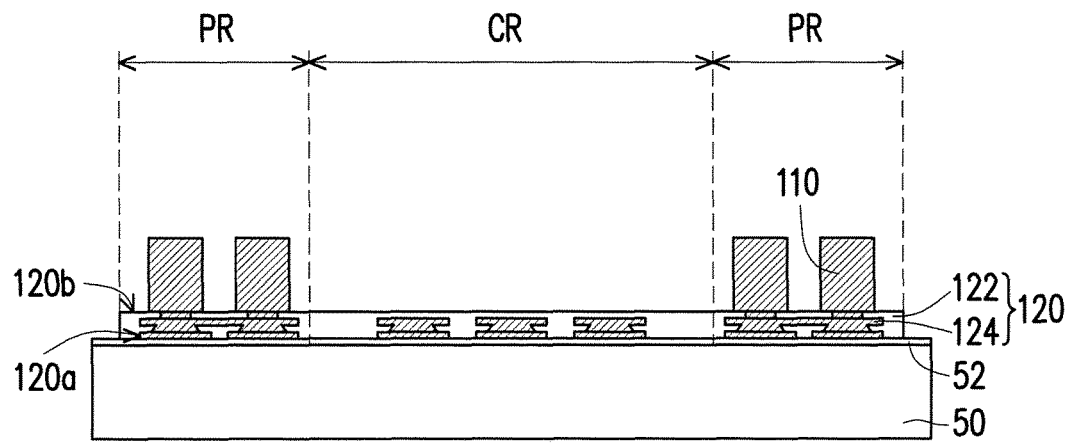
FIG. 1A to FIG. 1E are schematic cross-sectional views illustrating a manufacturing method of a package structure according to an embodiment of the disclosure.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1E are schematic cross-sectional views illustrating a manufacturing method of a package structure according to an embodiment of the disclosure. Referring to FIG. 1A, a plurality of conductive connectors 110 is formed on a circuit layer 120. For example, the circuit layer 120 may be formed on a carrier 50. The carrier 50 may be a glass substrate or a glass supporting board. In some embodiments, other suitable substrate material may be adapted as the carrier 50 as long the material is able to withstand the subsequent processes while carrying the package structure formed thereon. The circuit layer 120 may include a first surface 120a facing towards the carrier 50 and a second surface 120b opposite to the first surface 120a. In some embodiments, the first surface 120a of the circuit layer 120 may be in direct contact with the carrier 50. In some other embodiments, a de-bonding layer 52 may be disposed between the first surface 120a of the circuit layer 120 and the carrier 50 to enhance the releasibility of the circuit layer 120 from the carrier 50 in the subsequent processes. For example, the de-bonding layer 52 may be a LTHC (light to heat conversion) release layer or other suitable release layers, which is not limited thereto.

In some embodiments, the circuit layer 120 may be formed on a carrier 50 through a deposition process, a lithography process and an etching process, etc. For example, the circuit layer 120 may include a dielectric layer 122 and a patterned conductive layer 124 partially embedded in the dielectric layer 122. In some other embodiments, the circuit layer 120 may include a central region CR and a peripheral region PR electrically connected to the central region CR. The patterned conductive layer 124 may be formed in the peripheral region PR and/or the central region CR for further electrical connection. In some embodiments, a conductive material, such as copper, aluminium, or nickel, is deposited on the dielectric layer 122 by a sputtering process, an evaporation process or an electroplating process, and then the conductive material may be patterned by lithography and etching processes to form the patterned conductive layer 124. In some other embodiments, the patterned conductive layer 124 may be formed before the dielectric layer 122. The forming sequence of the dielectric layer 122 and the patterned conductive layer 124 may depend on the design requirement. A material of the dielectric layer 122 may include non-organic or organic dielectric materials such as silicon oxide, silicon nitride, silicon carbide, silicon oxynitride, polyimide, benezocyclobutene (BCB), or the like, which is not limited thereto.

In addition, the dielectric layer 122 may expose a portion of the patterned conductive layer 124 on the first surface 120a for further electrical connection. In some embodiments, the forming process of the dielectric layer 122 and the patterned conductive layer 124 may be performed multiple times to obtain the circuit layer 120 with multi-layered as required by the circuit design. The topmost dielectric layer 122 may then have openings exposing at least the portion of the topmost patterned conductive layer 124. In some embodiments, the patterned conductive layer 124 exposed by the dielectric layer 122 may be used as contact pads for further electrical connection. In addition, since the circuit layer 120 including the patterned conductive layer 124 may be used to redistribute the conductive trace for signal transmitting of the chip package, the circuit layer 120 may be referred to a redistribution layer.

Moreover, the conductive connectors 110 may be formed on the second surface 120b and in the peripheral region PR of the circuit layer 120 to electrically connect the patterned conductive layer 124. For instance, the conductive connectors 110 such as conductive pillars, solder balls, conductive bumps or other possible forms and shapes may be formed by a plating process, a deposition process, a ball placement process and/or a reflow process or other suitable process. A material of the conductive connectors 110 may be same as or similar with the material of the patterned conductive layer 124. However, the material and the forming process of the conductive connectors 110 construe no limitation in the disclosure.

Figure 1B:
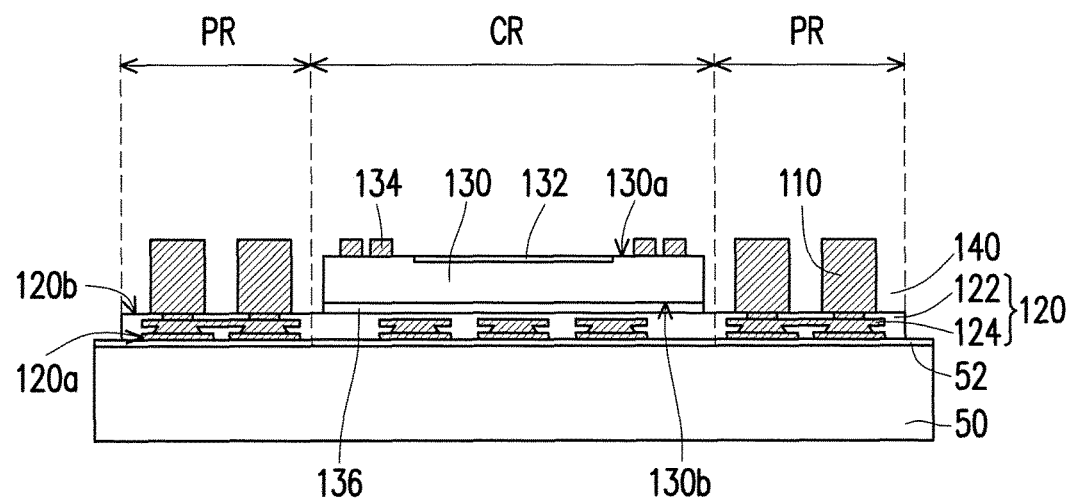

Referring to FIG. 1B, a chip 130 may be disposed on the second surface 120b and in the central region CR of the circuit layer 120. The chip 130 may include an active surface 130a at a distance from the circuit layer 120 and a back surface 130b opposite to the active surface 130a. The chip 130 may include a sensing area 132 located on the active surface 130a for accommodating sensors. For example, the chip 130 may include biometric sensors such as fingerprint-recognition sensors disposed in the sensing area 132. In some embodiments, the chip 130 may include physical sensors measuring changes to physical quantities (e.g., heat, light capacitance, pressure, etc.) or other suitable sensors may be utilized depending on the design requirement. In some embodiments, the chip 130 may include a plurality of conductive bumps 134 on the active surface 130a and surrounding the sensing area 132. For example, the conductive bumps 134 may include reflowed solder bumps, gold bumps, copper bumps or the like, which is not limited thereto.

Moreover, the back surface 130b of the chip 130 and the circuit layer 120 may adhere to each other using an adhesive layer 136. For example, the adhesive layer 136 may include epoxy resin, inorganic materials, organic polymer materials or other suitable adhesive materials, which is not limited thereto. In some embodiments, the adhesive layer 136 may be formed on the back surface 130b before disposing the chip 130 on the circuit layer 120. In some other embodiments, the adhesive layer 136 may be formed in the central region CR of the circuit layer 120 to subsequently bond to the back surface 130b of the chip 130.

Figure 1C:
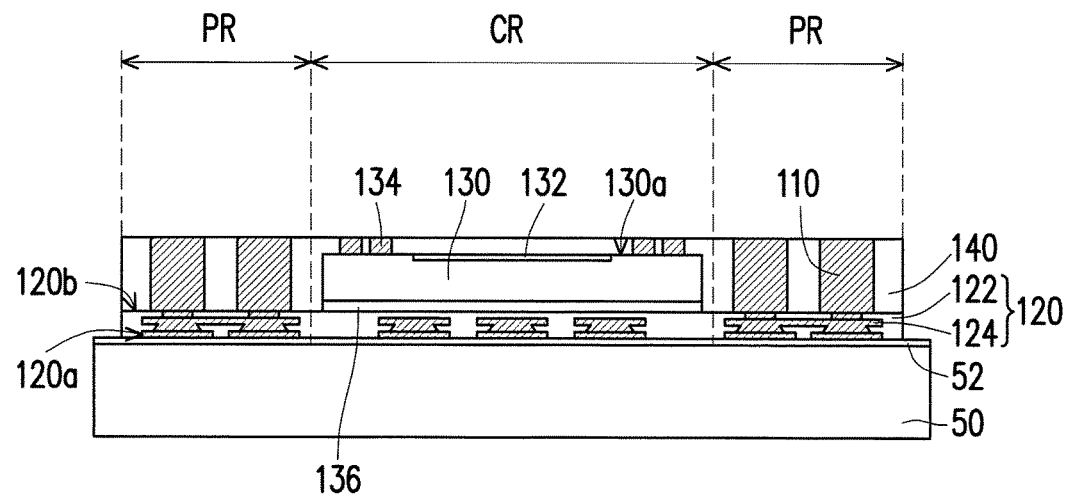

Referring to FIG. 1C, an encapsulant 140 is formed on the circuit layer 120 to encapsulate the chip 130 and the conductive connectors 110. The encapsulant 140 may include a molding compound formed by a molding process. In some embodiments, the encapsulant 140 may be formed by an insulating material such as epoxy or other suitable resins, which is not limited thereto. In some other embodiments, a thickness of the encapsulant 140 may be greater than a height of each of the conductive connectors 110. In such case, the thickness of the encapsulant 140 may further be reduced to expose at least a portion of the conductive connectors 110 and the conductive bumps 134 of the chip 130 for subsequent electrical connection. For example, the thickness of the encapsulant 140 may be reduced by a grinding process, an etching process, a milling process or a polishing process, which is not limited thereto. In some embodiments, after reducing the thickness of the encapsulant 140, at least a portion of the encapsulant 140 may remain on the active surface 130a and cover the sensing area 132 of the chip 130 for protection purpose. In such case, for example, the encapsulant 140 may include transparent materials to avoid reducing the sensitivity of sensors accommodating on the sensing area of the chip 130. In some other embodiments, after reducing the thickness of the encapsulant 140, the surface of the conductive connectors 110 exposed by the encapsulant 140 and the surface of the conductive bumps 134 exposed by the encapsulant 140 may be coplanar.

Figure 1D:
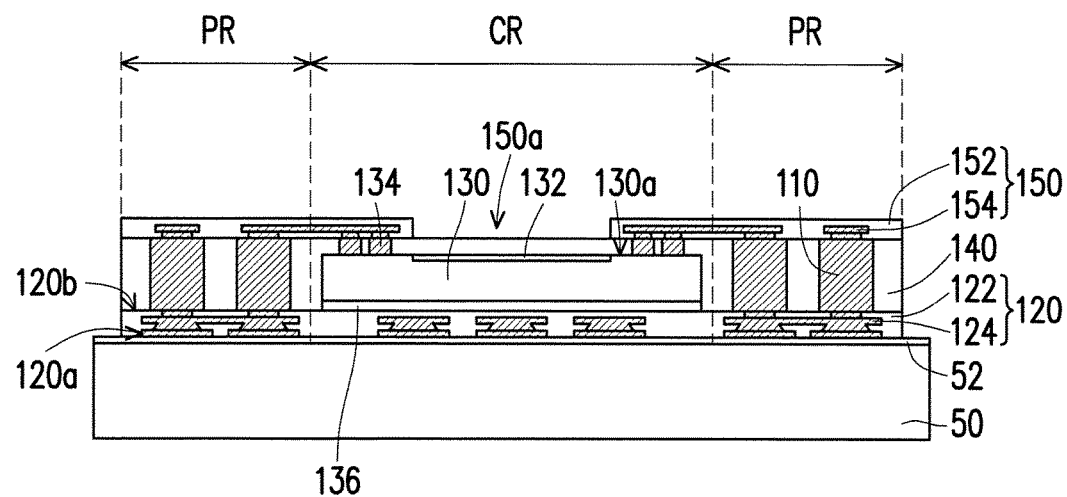

Referring to FIG. 1D, a redistribution layer 150 may be formed on the encapsulant 140 to electrically connect the chip 130 through the conductive bumps 134 and the conductive connectors 110 through the patterned conductive layer 124. In addition, the redistribution layer 150 may include a window 150a corresponding to the sensing area 132 of the chip 130. In other word, the redistribution layer 150 may partially cover the chip 130 where the conductive bumps 134 are formed and the window 150a of the redistribution layer 150 may expose the encapsulant 140 disposed above the sensing area 132 of the chip 130. For example, the redistribution layer 150 may include a dielectric layer 152 and a patterned conductive layer 154. A material and forming processes of the dielectric layer 152 may be same as or similar with the dielectric layer 122 and a material and forming processes of the patterned conductive layer 154 may be same as or similar with the patterned conductive layer 124. The detailed descriptions are omitted herein. In some embodiments, the window 150a of the redistribution layer 150 may be formed by lithography and etching processes and/or other suitable process, which is not limited thereto. As such, the circuit layer 120 and the redistribution layer 150 may be correspondingly formed on the active surface 130a and the back surface 130b of the chip 130. In other word, the circuit layer 120 and the redistribution layer 150 may be disposed on the two opposite sides of the chip 130.

Figure 1E:
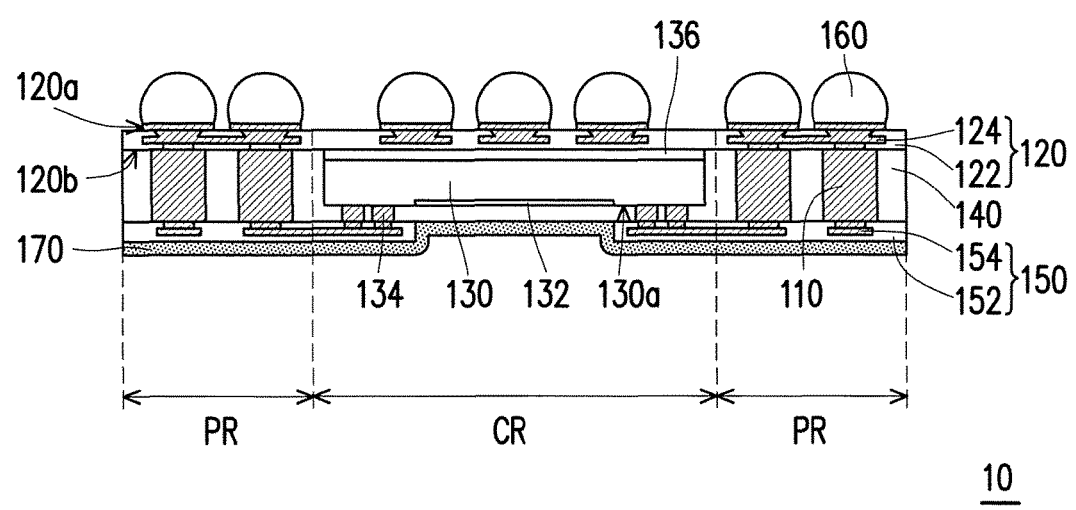

Referring to FIG. 1E, a cover layer 170 may be formed on the encapsulant 140 while the carrier 50 is bonded to the circuit layer 120. For example, the cover layer 170 may conformally cover the window 150a of the redistribution layer 150 through a deposition process, a spin coating process, a slit coating process or other suitable process, which is not limited thereto. In some embodiments, the cover layer 170 may be formed on a top surface of the redistribution layer 150 opposite to the conductive bumps 134 of the chip 130 to cover the dielectric layer 152 and also formed conformally along an inner surface of the window 150a of the redistribution layer 150, thereby providing sufficient protection and structural strength. In other word, the cover layer 170 formed on the redistribution layer 150 and the encapsulant 140 may have a concave area corresponding to the sensing area 132 of the chip 130. For example, the cover layer 170 may be a hard coat layer formed from polymer, curable resin or other suitable protective materials, which is not limited thereto. In some embodiments, the cover layer 170 may be transparent according to the design requirement. After forming the cover layer 170, the carrier 50 may be removed from the circuit layer 120 to expose the patterned conductive layer 124 by peeling off the de-bonding layer 52, using external energy such as UV laser, visible light, or heat applied to the de-bonding layer 52, or other suitable techniques, which is not limited thereto. In some embodiments, without forming the de-bonding layer 52 between the carrier 50 and the circuit layer, removing the carrier 50 from the circuit layer 120 may be performed by physical treatment (e.g. laser lift-off process) or chemical treatment (e.g. chemical etching).

In some embodiments, after removing the carrier 50 from the circuit layer 120, a plurality of conductive structures 160 may be formed on the first surface 120a of the circuit layer 120 to form a package structure 10. In other word, the circuit layer 120 may be disposed between the conductive connectors 110 and the conductive structures 160. In some embodiments, the conductive structures 160 may be disposed on the encapsulant 140 opposite to the redistribution layer 150. The conductive structures 160 may be electrically connected to the redistribution layer 150 through the conductive connectors 110. For example, a material of the conductive structures 160 may include copper, tin, gold, nickel or other suitable conductive material, which is not limited thereto. The conductive structures 160 may be formed as conductive bumps, conductive pillars, or solder balls by a ball placement process and a reflow process. It should be noted that other possible forms and shapes of the conductive structures 160 may be utilized for electrical connection, which is not limited thereto. In some other embodiments, the topmost patterned conductive layer 124 exposed from the carrier 50 may sometimes be referred as under-ball metallurgy (UBM) patterns for ball mount.

In some embodiments, the conductive structures 160 may form an array arranged to have fine pitch on the first surface 120a of the circuit layer 120 for requirement in the subsequent processes. In the cross-sectional view, the height of the package structure 10 may be inconsistent due to the window 150a of the redistribution layer 150 and the concave area of the cover layer 170. In other word, the height of the package structure 10 corresponding to the sensing area 132 of the chip 130 is less than the height of the package structure 10 corresponding to the peripheral region PR. As such, the thickness of the package structure 10 corresponding to the sensing area 132 of the chip 130 is reduced, thereby achieving an improved sensitivity for sensors. Taking fingerprint-recognition sensors disposed in the sensing area 132 of the chip 130 for example, when putting a finger (not illustrated) on the cover layer 170 corresponding to the sensing area 132, the identification efficiency of fingerprints may be enhanced due to the reduced distance between the finger and the sensing area 132.

Figure 2A:
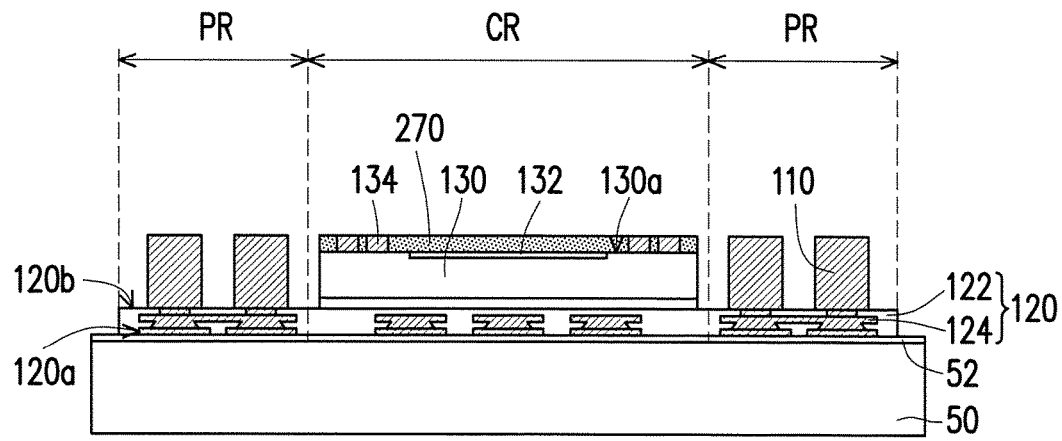
FIG. 2A to FIG. 2C are schematic cross-sectional views illustrating a manufacturing method of a package structure according to an embodiment of the disclosure.
Figure 2B:
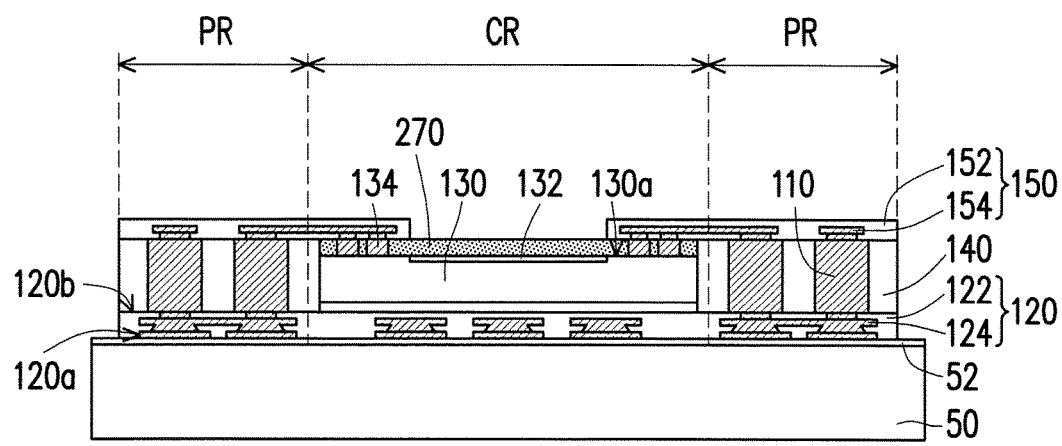
Figure 2C:
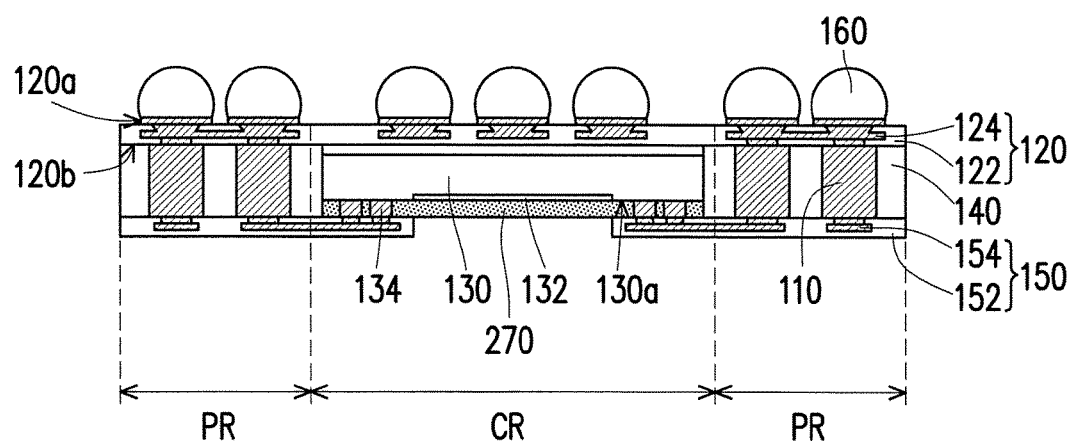

FIG. 2A to FIG. 2C are schematic cross-sectional views illustrating a manufacturing method of a package structure according to an embodiment of the disclosure. Referring to FIG. 2A, the conductive connectors 110 is formed on the circuit layer 120. The forming processes of the conductive connectors 110 and the circuit layer 120 are similar as the process shown in FIG. 1A and the detailed descriptions are omitted herein. In addition, the chip 130, similar as shown in FIG. 1B, may be disposed on the central region CR and include the conductive bumps 134. However, the difference between the chip shown in FIG. 1B and the present embodiment is in that the cover layer 270 may be formed on the active surface 130a to protect the sensing area 132 of the chip 130. In some embodiments, the cover layer 270 may cover the side walls of the conductive bumps 134 and expose at least a portion of the top surface of the conductive bumps 134 for further electrical connection.

Referring to FIG. 2B, the encapsulant 140 may be formed on the circuit layer 120 to encapsulate the chip 130 and the conductive connectors 110. In some embodiments, the cover layer 270 may be exposed by the encapsulant 140, thereby reducing the thickness corresponding to the sensing area 132 of the chip 130. In addition, the redistribution layer 150 may be formed on the encapsulant 140 to electrically connect the chip 130 through the conductive bumps 134 and the conductive connectors 110 through the patterned conductive layer 124. The window 150a of the redistribution layer 150 may be formed corresponding to the sensing area 132 of the chip 130. In some embodiments, the redistribution layer 150 may partially cover the cover layer 270 and the window 150a may expose a portion of the cover layer 270 disposed above the sensing area 132 of the chip 130. The forming processes of the encapsulant 140 and the redistribution layer 150 are similar as the processes shown in FIG. 1C and the FIG. 1D and the detailed descriptions are omitted herein.

Referring to FIG. 2C, the carrier 50 may be removed from the circuit layer 120 to expose the patterned conductive layer 124. The conductive structures 160 may be subsequently formed on the first surface 120a of the circuit layer 120 to electrically connect the patterned conductive layer 124 so as to form a package structure 20. The removing process of the carrier 50 and the forming process of the conductive structures 160 may be similar as the processes described in FIG.

1E and the detailed descriptions are omitted herein. In the package structure 20, the active surface 130a of the chip 130 is covered by the cover layer 270 without encapsulant 140 formed thereon and the window 150a of the redistribution layer 150 is corresponding to the sensing area 132 of the chip 130 such that it may prevent the sensitivity of the sensing area 132 from being affected by the thick encapsulant 140. In addition, since the conductive connectors 110 may be used as the vertical interconnection between the circuit layer 120 and the redistribution layer 150, the overall thickness of the package structure 20 may be reduced with improved sensing capabilities.

Figure 3A:
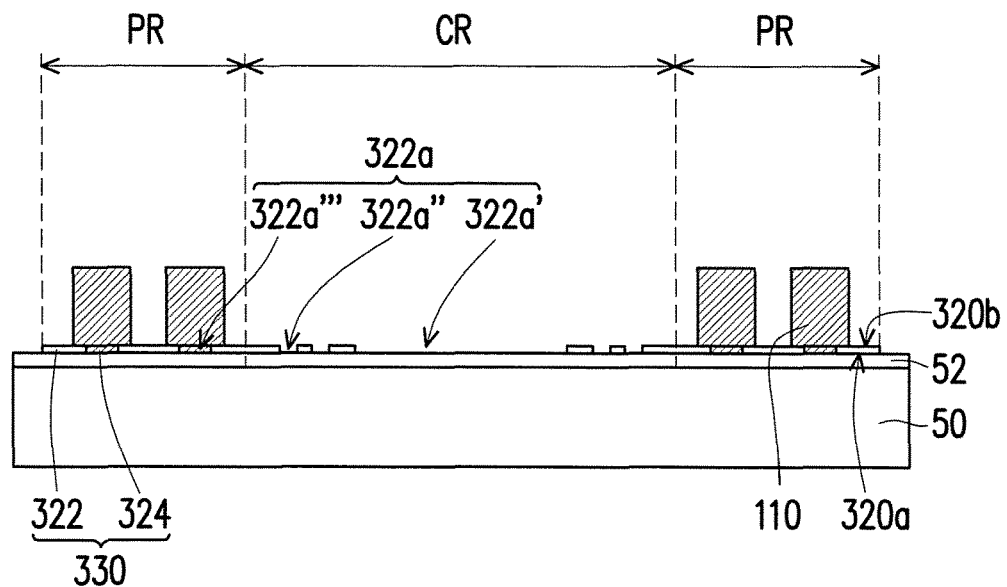
FIG. 3A to FIG. 3F are schematic cross-sectional views illustrating a manufacturing method of a package structure according to an embodiment of the disclosure.

FIG. 3A to FIG. 3F are schematic cross-sectional views illustrating a manufacturing method of a package structure according to an embodiment of the disclosure. Referring to FIG. 3A, a circuit layer 320 may be formed on the carrier 50 through a deposition process, a lithography process and an etching process, etc., which is not limited thereto. For example, the circuit layer 320 may include a first surface 320a facing towards the carrier 50 and a second surface 320b opposite to the first surface 320a. In addition, the circuit layer 320 may include the central region CR and the peripheral region PR surrounding the central region CR. The conductive connectors 110 may be formed on the second surface 320b and in the peripheral region PR of the circuit layer 320. In some embodiments, the circuit layer 320 may include a patterned dielectric layer 322 and a conductive layer 324 formed in the patterned dielectric layer 322. In other word, the conductive layer 324 may be embedded in the patterned dielectric layer 322.

For example, a dielectric layer may be formed on the carrier 50. Subsequently, the dielectric layer may be patterned to form a plurality of openings 322a in the central region CR and the peripheral region PR using, for example, lithography and etching processes, thereby forming the patterned dielectric layer 322. For example, the openings 322a may include an opening 322a' corresponding to the sensing area 332a, a plurality of the openings 322a" surrounding the opening 322a' and formed in the central region CR and a plurality of a plurality of openings 322a''' formed in the peripheral region PR. Next, the conductive layer 324 may be formed in the openings 322a corresponding to the peripheral region PR. Subsequently, the conductive connectors 110 may be formed and electrically connected to the conductive layer 324. The forming process of the conductive connectors 110 may be similar with the process shown in FIG. 1A, thus, the detailed descriptions are omitted herein. In some embodiments, the de-bonding layer 52 may be disposed between the first surface 320a of the circuit layer 320 and the carrier 50 to enhance the releasibility of the circuit layer 320 from the carrier 50 in the subsequent processes.

Figure 3B:
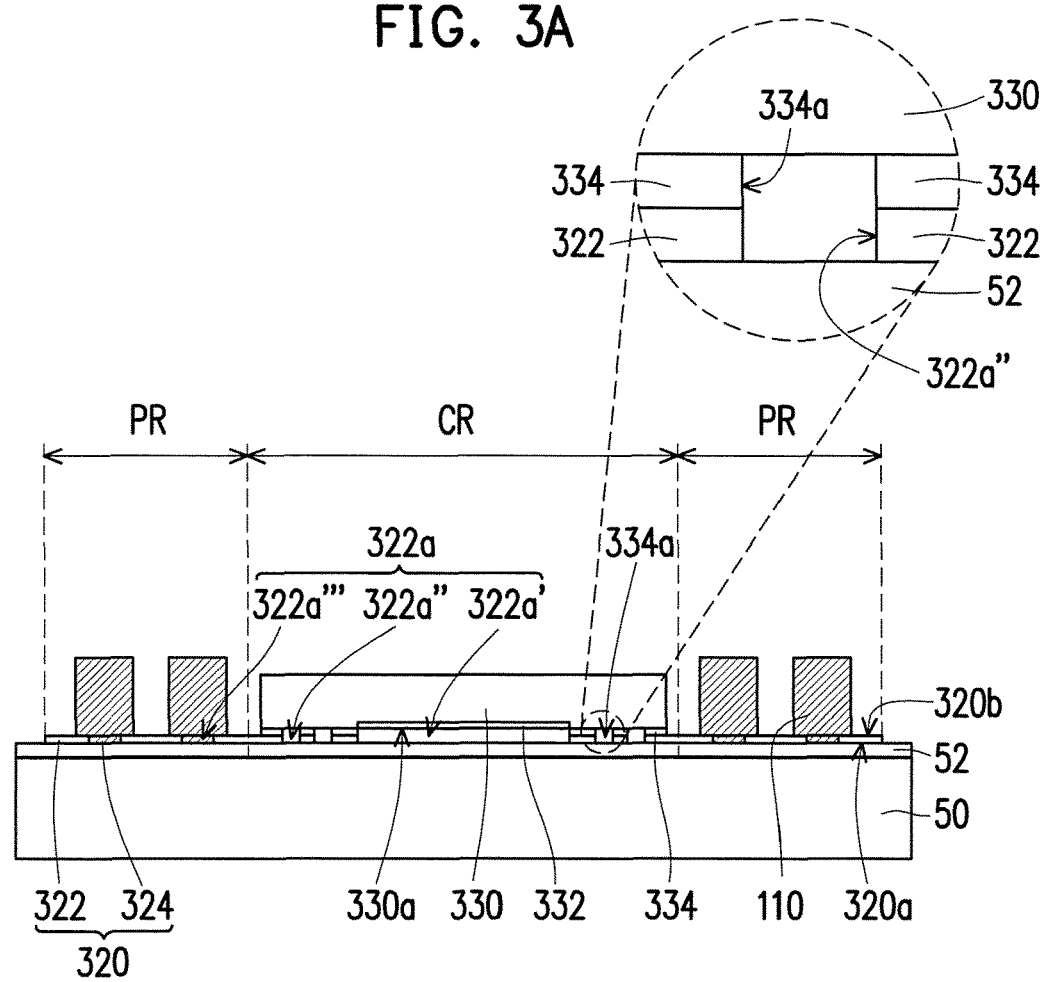

Referring to FIG. 3B, a chip 330 may be disposed on the carrier 50 and in the central region CR of the circuit layer 320. An active surface 330a of the chip 320 may face towards the second surface 320b of the circuit layer 320. For example, the chip 330 may include a sensing area 332 on the active area 330a. It should be noted that the chip 330 may be similar with the chip 130 and the detailed descriptions are omitted herein. In some embodiments, the sensing area 332 of the chip 330 may be correspondingly positioned to the openings 322a' of the patterned dielectric layer 322 on the central region CR of the circuit layer 320. In other word, after disposing the chip 330 on the circuit layer 320, there is a gap between the sensing area 332 of the chip 330 and the second surface 320b of the circuit layer 320. It should be noted that the sizes of the openings 322a in the central region CR may be different. For example, the size of the openings 322a' corresponding to the sensing area 332 may be greater than the sizes of the openings 322a" corresponding to pads in the active surface 330a of the chip 330 in the central region CR.

In some embodiments, the chip 330 may further include a patterned bonding layer 334 disposed on the active surface 330a and surrounding the sensing area 332 by coating process, lithography, etching process and/or other suitable processes. For instance, the patterned bonding layer 334 may include a plurality of openings 334a corresponding to the openings 322a" of the patterned dielectric layer 322 in the central region CR. The area of the openings 334a of the patterned bonding layer 334 may be greater than or equal to the area of the openings 322a" of the patterned dielectric layer 322 in the central region CR. The chip 330 may be bonded to the circuit layer 320 using the patterned bonding layer 334 after disposing the chip 330 in the central region CR of the circuit layer 320. As such, the patterned bonding layer 334 may be used as an adhesive and/or served as a spacer spaced apart between the active surface 330a and the second surface 320b of the circuit layer 320. In some embodiments, the patterned bonding layer 334 may be also served as a dam surrounding the sensing area 332 of the chip 330 for protection purpose. In some other embodiments, the patterned bonding layer 334 may include a half-cured or a B-stage adhesive, which is not limited thereto. For example, the chip 330 may be pre-cured by heating or ultraviolet rays to make the patterned bonding layer 334 with two-stage property become an adhesive film with B-stage property such that the chip 330 and the circuit layer 320 may be adhered to each other.

Figure 3C:
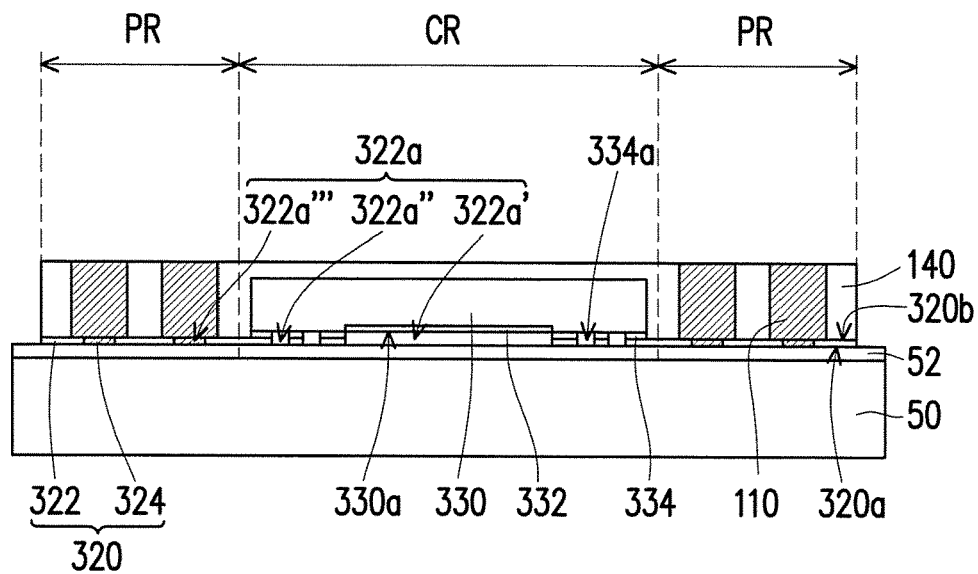

Referring to FIG. 3C, the encapsulant 140 may be formed on the second surface 320b of the circuit layer 320 to encapsulate the chip 330 and the conductive connectors 110. In addition, after forming the encapsulant 140, the thickness of the encapsulant 140 may be reduced to expose at least a portion of the conductive connectors 110. The forming process of the encapsulant 140 may be similar as the processes shown in FIG. 1C and the detailed descriptions are omitted herein. In some embodiments, after forming the encapsulant 140, the thickness of the encapsulant 140 may be reduced by such as a grinding process, or other suitable process to expose at least a portion of the conductive connectors 110 and/or the chip 330. In some other embodiments, a portion of the chip 330 may be removed during reducing the thickness of the encapsulant 140 according to the design requirement. In other word, a rear surface of the chip 330 opposite to the active surface 330a may be exposed by the encapsulant 140 such that the overall thickness of the chip 330 may be reduced. In the embodiment illustrated in FIG. 1C, the reduced thickness of the encapsulant 140 may at least depend on the height of the conductive bumps 134, while in the present embodiment, the reduced thickness of the encapsulant 140 may at least depend on the distance to expose the rear surface of the chip 330. In some embodiments, since the patterned bonding layer 334 may be used as the dam, the encapsulant 140 may not be formed in the central region CR corresponding to the active surface 330a of the chip 330.

Figure 3D:
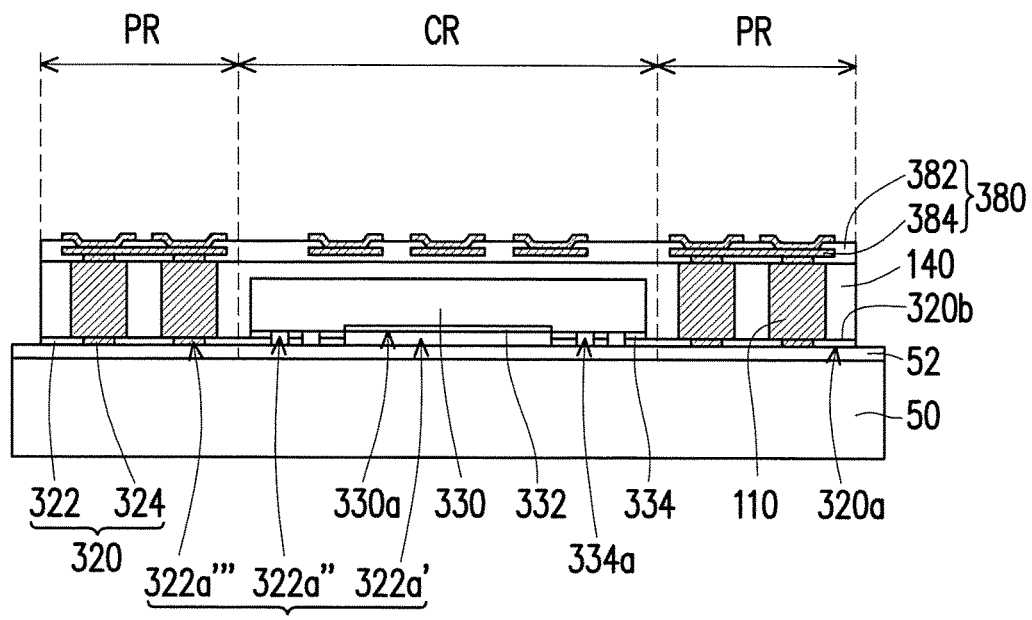

Referring to FIG. 3D, a patterned circuit layer 380 is formed on the encapsulant 140 to electrically connect the conductive connectors 110 exposed by the encapsulant 140. As such, the conductive connectors 110 are electrically connected between the circuit layer 320 and the patterned circuit layer 380. In some embodiments, the patterned circuit layer 380 may include a dielectric layer 382 and a patterned conductive layer 384 partially embedded in the dielectric layer 382. In some other embodiments, the patterned conductive layer 384 may be formed in the peripheral region PR and/or the central region CR for further electrical connection. The dielectric layer 382 and the patterned conductive layer 384 may be similar with the dielectric layer 122 and the patterned conductive layer 124. The detailed descriptions are omitted herein. After forming the patterned circuit layer 380, the carrier 50 may be removed from the circuit layer 320 to expose the circuit layer 320 and the sensing area 332 of the chip 330. The removing process of the carrier 50 may be similar with the aforementioned removing process and the detailed descriptions are omitted herein.

Figure 3E:
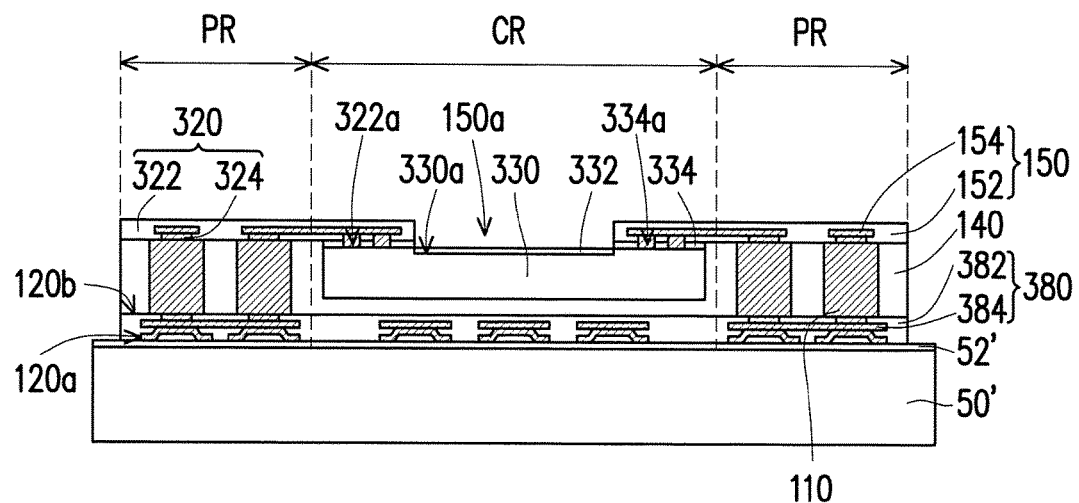

Referring to FIG. 3E, after removing the carrier 50, the chip 330 may be flipped upside down to form the redistribution layer 150 on the encapsulant 140. In some embodiments, the redistribution layer 150 may include the dielectric layer 152 and the patterned conductive layer 154 formed on the encapsulant 140. In addition, the patterned conductive layer 154 may be electrically connected to the conductive connectors 110 in the peripheral region PR.

In some embodiments, a portion of the redistribution layer 150 may be formed on the patterned bonding layer 334 filling the openings 334a of the patterned bonding layer 334 and the openings 322a" of the patterned dielectric layer 322 to partially cover the chip 330 in the central region CR while the window 150a exposes the sensing area 332 of the chip 330. For example, the redistribution layer 150 may be formed on the patterned bonding layer 334 with the patterned conductive layer 154 filling in the openings 334a and the openings 322a" corresponding to the openings 334a. As such, the portion of the patterned conductive layer 154 filling in the openings 334a of the patterned bonding layer 334 and the openings 322a" corresponding to the openings 334a may be used as the conductive bumps of the chip 130, thereby achieving the simplified manufacturing processes.

In some embodiments, before forming the redistribution layer 150, the chip 330 may be flipped upside down to dispose the patterned circuit layer 380 on a carrier 50' for supporting purpose after removing the carrier 50. In some other embodiments, a de-bonding layer 52' may be disposed between the patterned circuit layer 380 and the carrier 50' to enhance the releaseability therebetween. The carrier 50' and the de-bonding layer 52' may be similar with the carrier 50 and the de-bonding layer 52 and the detailed descriptions are omitted herein.

Figure 3F:
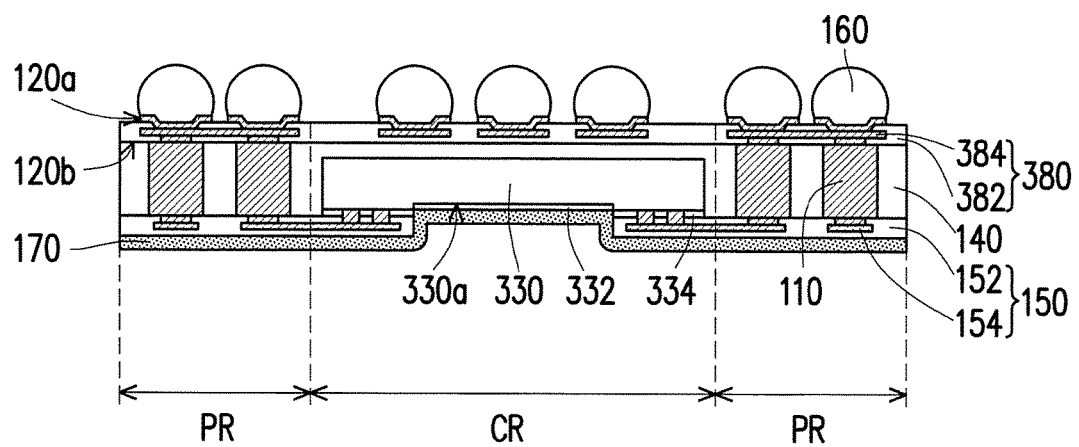

Referring to FIG. 3F, the cover layer 170 may be formed on the encapsulant 140 while the carrier 50' is bonded to the patterned circuit layer 380. For example, the cover layer 170 may conformally cover the window 150a of the redistribution layer 150. As such, a portion of the cover layer 170 may be formed in the opening 322a' of the patterned dielectric layer 322 corresponding to the sensing area 332. In some embodiments, a portion of the cover layer 170 may be formed on the active surface 330a of the chip 330 and may be coplanar to the surface of patterned bonding layer 334 facing the active surface 330a of the chip 330. The forming process of the cover layer 170 may be similar with the process shown in FIG. 1E and the detailed descriptions are omitted herein.

In some other embodiments, after forming the cover layer 170, the carrier 50' and de-bonding layer 52' may be removed to expose the patterned conductive layer 384 of the patterned circuit layer 380 for further electrical connection. The removing process of the carrier 50' and de-bonding layer 52' may be similar with the carrier 50 and de-bonding layer 52 and the detailed descriptions are omitted herein.

Furthermore, the conductive structures 160 may be formed on the patterned conductive layer 384 of the patterned circuit layer 380 to form a package structure 30. The forming process of the conductive structure 160 may be similar with the process shown in FIG. 1E and the detailed descriptions are omitted herein.

Figure 4A:
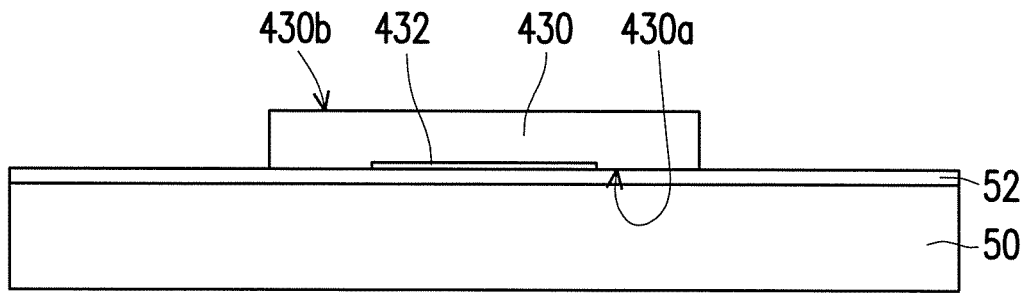
FIG. 4A to FIG. 4F are schematic cross-sectional views illustrating a manufacturing method of a package structure according to an embodiment of the disclosure.

FIG. 4A to FIG. 4F are schematic cross-sectional views illustrating a manufacturing method of a package structure according to an embodiment of the disclosure. Referring to FIG. 4A, a chip 430 may be disposed on the carrier 50. For example, the chip 430 may include an active surface 430a facing towards the carrier 50 and a back surface 430b opposite to the active surface 430a. The chip 430 may include a sensing area 432 on the active surface 430a similar as the chip 130 and the detailed descriptions are omitted herein. In some other embodiments, the active surface 430a of the chip 430 may be bonded to the carrier 50 through the de-bonding layer 52. The bonding process of the chip 430 in the present embodiment may be similar to the embodiment illustrated in FIG. 1A, while the difference lies in that instead of bonding the back surface of the chip 130, in the present embodiment, the active surface 430a may be bonded to the carrier 50.

Figure 4B:
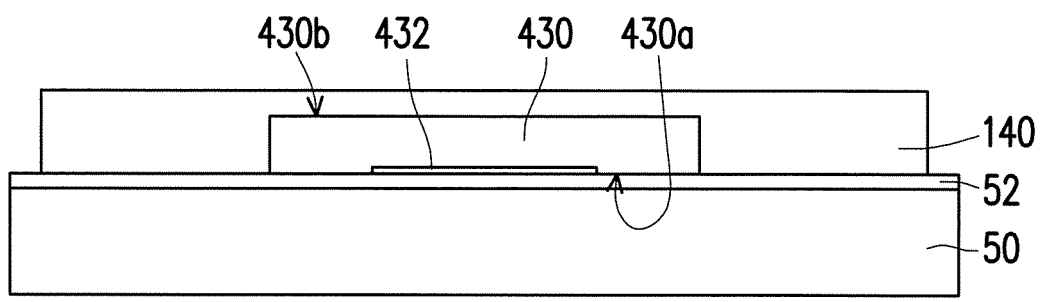

Referring to FIG. 4B, the chip 430 may be encapsulated by the encapsulant 140. For example, the encapsulant 140 may be formed on the carrier 50 to cover the back surface 430b of the chip 430. The material and the forming process of the encapsulant 140 may be similar as described in FIG. 1C and the detailed descriptions are omitted herein. In some embodiments, the grinding process of the encapsulant 140 may occur after encapsulation depending on the design requirements.

Figure 4C:
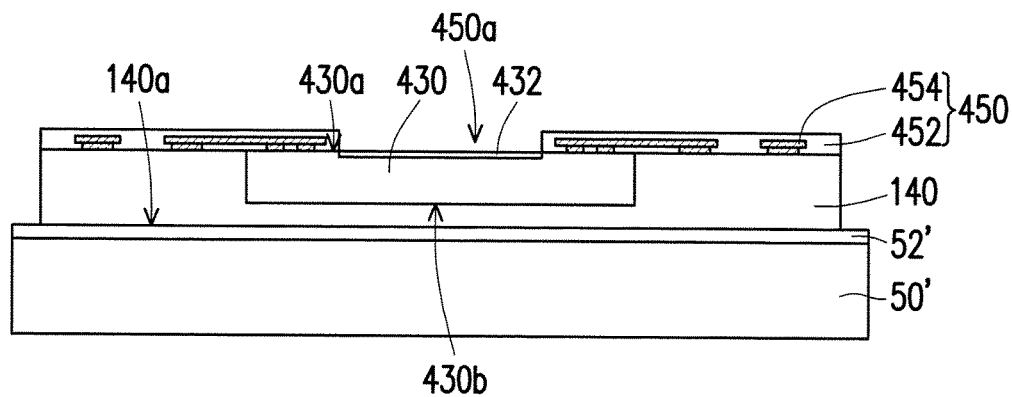

Referring to FIG. 4C, the carrier 50 and the de-bonding layer 52 may be removed from the encapsulant 140 to expose the sensing area 432 of the chip 430 and the contact pads (not illustrated) of the chip 430 for the subsequent electrical connection. The removing process of the carrier 50 may be similar as described in FIG. 1E and the detailed descriptions are omitted herein. Next, the chip 430 may be flipped upside down and disposed on the carrier 50' for supporting purpose in the proceeding processes. For example, the encapsulant 140 may have a surface 140a opposite to the active surface 430a of the chip 430. The surface 140a of the encapsulant 140 may be bonded to the carrier 50' through the de-bonding layer 52' similar as aforementioned and the detailed descriptions are omitted herein. Subsequently, a first redistribution layer 450 may be formed on the encapsulant 140 to electrically connect the active surface 430a of the chip 430.

For example, the first redistribution layer 450 may include a window 450a corresponding to the sensing area 432 of the chip 430. In other word, the first redistribution layer 450 may cover the encapsulant 140 and partially cover the chip 430 with the sensing area 432 exposed by the first redistribution layer 450. The first redistribution layer 450 may be similar with the redistribution layer 150. In some embodiments, the first redistribution layer 450 may include a dielectric layer 452 and a patterned conductive layer 454 electrically connected to the chip 430. The material and forming processes of the first redistribution layer 450 may be same as or similar with the redistribution layer 150 and the detailed descriptions are omitted herein. In some embodiments, the window 450a of the first redistribution layer 450 may be formed by lithography and etching processes or other suitable processes, which is not limited thereto. It should be noted that the patterned conductive layer 454 of the first redistribution layer 450 may be electrically connected to the chip 430 surrounding to the sensing area 432 and serving as the conductive bumps of the chip 430.

Figure 4D:
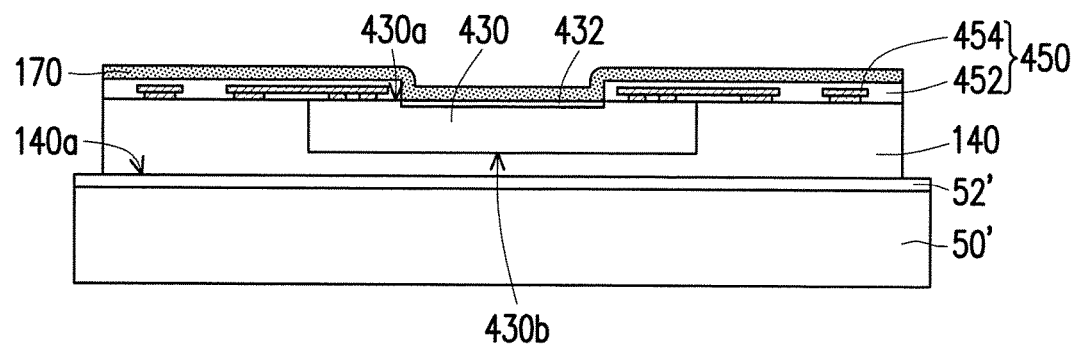

Referring to FIG. 4D, the cover layer 170 may be formed on the first redistribution layer 450 while the carrier 50' is bonded to the surface 140*a* of the encapsulant 140 for supporting purpose. In some embodiments, the cover layer 170 may conformally cover the window 450*a* of the first redistribution layer 450 such that the cover layer 170 may protect the sensing area 432 of the chip 430. In other word, the cover layer 170 formed on the first redistribution layer 450 and the chip 430 may have a concave area corresponding to the sensing area 432 of the chip 430. The material and the forming process of the cover layer 170 may be similar as described in FIG. 1E and the detailed descriptions are omitted herein. In some embodiments, taking fingerprint-recognition sensors disposed in the sensing area 432 of the chip 430 for example, when a user put his/her finger (not illustrated) on the concave area of the cover layer 170 corresponding to the sensing area 432, since the distance between the finger and the sensing area 432 is reduced, it may enhance the identification efficiency of fingerprints. It should be noted that for other types of sensors, it may also improve the sensitivity of the sensors due to such configuration.

Figure 4E:
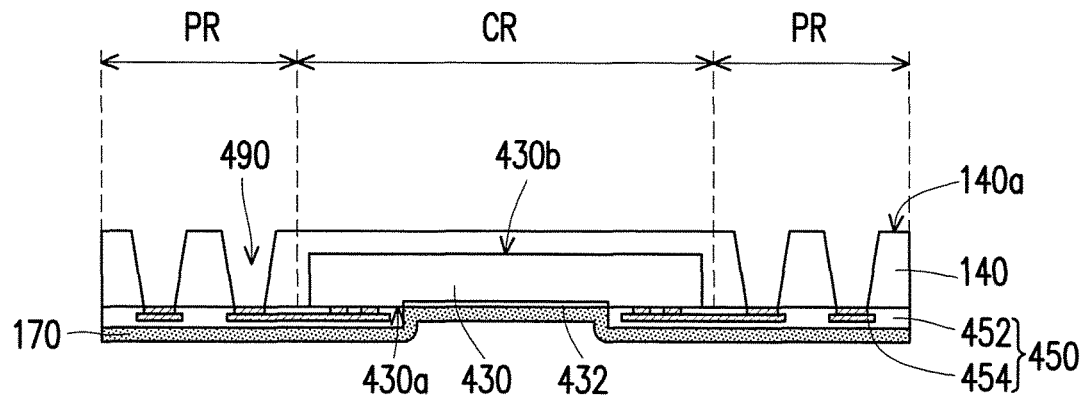

Referring to FIG. 4E, after forming the cover layer 170, the carrier 50' and the de-bonding layer 52' may be removed from the encapsulant 140 to expose the surface 140*a*. The removing process of the carrier 50' may be similar as described in FIG. 3E and the detailed descriptions are omitted herein. After removing the carrier 50', a plurality of vias 490 may be formed through the encapsulant 140 to expose at least a portion of the first redistribution layer 450. In other word, the encapsulant 140 may be penetrated by the vias 490. For example, the first redistribution layer 450 may include a central region CR and a peripheral region PR surrounding to the central region CR. The chip 430 may be disposed in the central region CR and the vias 490 may be formed in the peripheral region PR such that the vias 490 may be formed surrounding the chip 430. In some embodiments, the vias 490 may be formed from the surface 140*a* to the first redistribution layer 450, thereby exposing at least a portion of the patterned conductive layer 454 using such as laser drilling, mechanical drilling, etching or other suitable techniques, which is not limited thereto. As such, at least a portion of the patterned conductive layer 454 exposed by the vias 490 may be used as the contact pads for the further electrical connection.

Figure 4F:
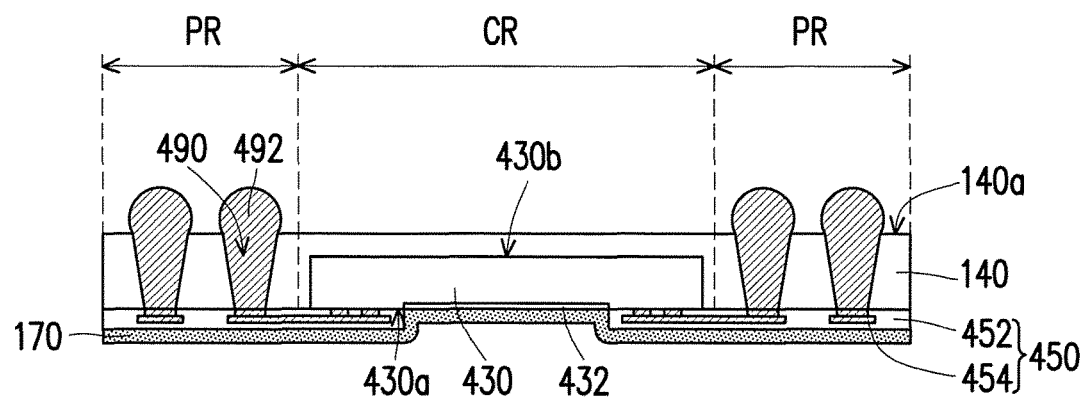

Referring to FIG. 4F, a plurality of conductive structures 492 may be formed on the encapsulant 140 and electrically connected the first redistribution layer 450 to form a package structure 40. In some embodiments, the conductive structures 492 may be formed corresponding to the vias 490. In other word, the conductive structures 492 may be formed on the surface 140*a* of the encapsulant 140 corresponding to the vias 490 with a portion of the conductive structures 492 filling in the vias 490. For example, the conductive structures 492 such as solder ball, bumps, conductive pillars may be formed corresponding to the vias 490 to directly contact the patterned conductive layer 454 exposed by the vias 490. In some other embodiments, solder may be formed corresponding to the vias 490 by a plating process, a screen printing process or other suitable processes. A reflow process may then be performed to form the conductive structures 492. For example, the conductive structures 492 may include tin, lead, copper, gold, nickel, a combination thereof or other suitable conductive materials, which is not limited thereto. It should be noted that other possible materials, forms and shapes of the conductive structures 492 may be utilized. In some embodiments, the conductive structures 492 may provide finer interconnect pitch and increases I/O density. As such, since the conductive structures 492 may be used as the conductive path for the external electrical connection and also served as the vertical interconnect in the package structure 40, the overall thickness of the package structure 40 may be reduced with simplified manufacturing processes. It is worthy to note that in the cross-sectional view, the height of the package structure 40 is inconsistent due to the window 450*a* of the first redistribution layer 450 and the concave area of the cover layer 170. In other word, the height of the package structure 40 corresponding to the sensing area 432 of the chip 430 is less than the height of the package structure 40 corresponding to the peripheral region PR. As such, the thickness of the package structure 40 corresponding to the sensing area 432 of the chip 430 is reduced, thereby achieving an improved sensitivity for sensors.

Figure 5A:
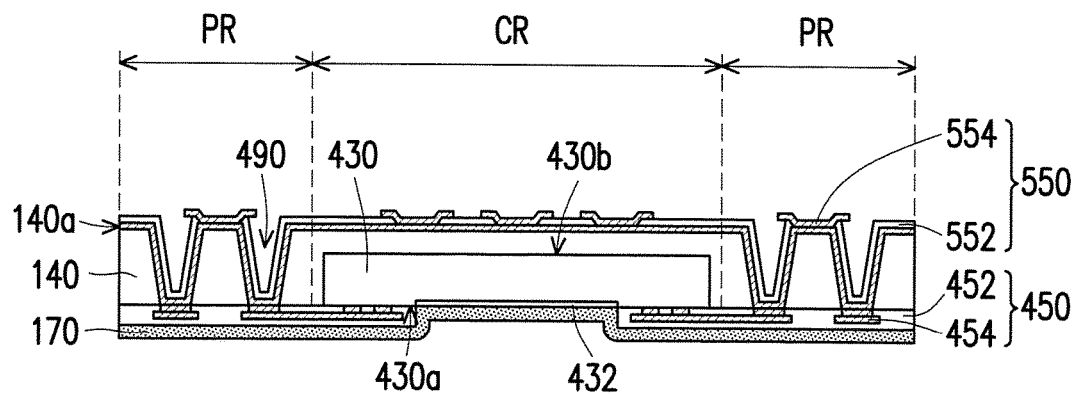
FIG. 5A to FIG. 5B are schematic cross-sectional views illustrating a manufacturing method of a package structure according to an embodiment of the disclosure.
Figure 5B:
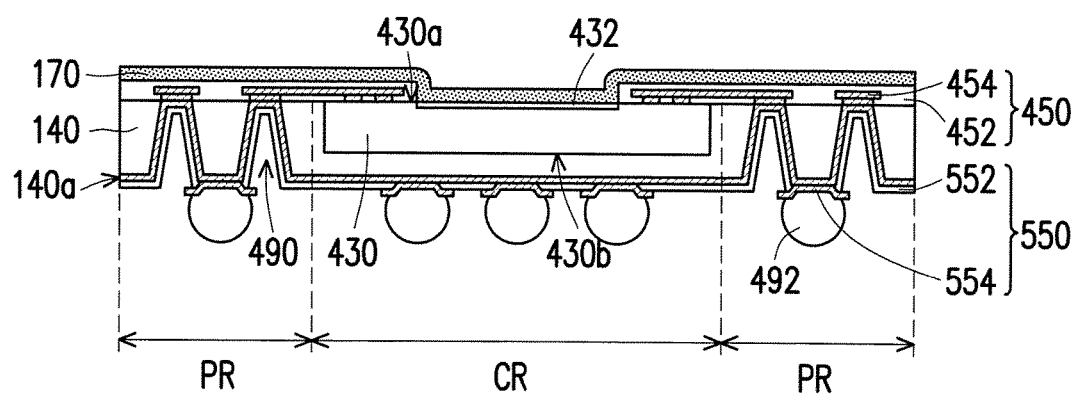

FIG. 5A to FIG. 5B are schematic cross-sectional views illustrating a manufacturing method of a package structure according to an embodiment of the disclosure. The present embodiment illustrated in FIG. 5A is similar with the embodiment shown in FIG. 4E, while the difference therebetween lies in that in the present embodiment, after forming the vias 490, a second redistribution layer 550 may be formed on the encapsulant 140 and in the vias 490. In other word, the second redistribution layer 550 may be conformally formed along an inner surface (not illustrated) of the vias 490 through deposition process. The second redistribution layer 550 may include a dielectric layer 552 and a patterned conductive layer 554. For example, after forming the vias 490, a first metallic layer may be conformally formed on the surface 140*a* of the encapsulant 140 to electrically connect the exposed patterned conductive layer 454 using a deposition process or other suitable process, which is not limited thereto. Next, the dielectric layer 552 may be conformally formed on the first metallic layer with a least a portion of the first metallic material is exposed by the dielectric layer 552. For example, part of the dielectric layer 552 located outside the vias 490 may be removed by lithography and etching processes to form a plurality of recesses. Subsequently, a second metallic layer may be formed on the first metallic layer corresponding to the recesses of the dielectric layer 552 so as to form the patterned conductive layer 554. A material of the patterned conductive layer 554 may include tin, lead, copper, gold, nickel, a combination thereof or other suitable conductive materials, which is not limited thereto. A material of the dielectric layer 552 may be similar with the dielectric layer 122 and the detailed descriptions are omitted herein. In some embodiments, the forming process of the dielectric layer 552 and the patterned conductive layer 554 may be performed multiple times to obtain the second redistribution layer 550 with multi-layered as required by the circuit design. In some other embodiments, the topmost patterned conductive layer 554 formed on the surface 140*a* of the encapsulant 140 and outside the vias 490 may sometimes be referred as under-ball metallurgy (UBM) patterns for ball mount.

Referring to FIG. 5B, the conductive structures 492 may be formed on the second redistribution layer 550 outside the vias 490 to electrically connect the second redistribution layer 550 so as to form a package structure 50. In some embodiments, the second redistribution layer 550 may provide the similar function as the conductive connectors for electrically connecting the first redistribution layer 450 to the conductive structures 492. In some embodiments, a portion of the conductive structures 492 may be formed corresponding to the chip 430 and/or surrounding the chip 430 depending on the design requirement. In some other embodiments, the conductive structure 492 may be formed corresponding to the vias 490 similar as shown in FIG. 4F according to the design requirement. As such, it may open the possibility to various package structure designs.

Based on the above, the redistribution layer includes a window corresponding to the sensing area of the chip and the cover layer covers the redistribution layer and the chip may also include a concave area corresponding to the window of the redistribution layer. As such, the distance between the cover layer and the sensing area is reduced, thereby achieving improved sensing capabilities of the package structure. Moreover, a portion of the redistribution layer partially covering the chip may be used as the conductive bumps on the active surface of the chip, thereby achieving the simplified manufacturing processes. In addition, since the redistribution layers are formed on the active surface and the back surface of the chip and the conductive connectors are vertically connected therebetween, the simplicity of the manufacturing process of the package structure may be realized, thereby reducing the overall manufacturing cost. Furthermore, the conductive structures may be used as the conductive path for the external electrical connection and/or served as the vertical interconnect in the package structure. As a result, the overall thickness of the package structure may be reduced with simplified manufacturing processes and the finer interconnect pitch and increased I/O density may be provided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a package structure, comprising:
   forming a plurality of conductive connectors on a circuit layer, wherein the circuit layer comprises a central region and a peripheral region electrically connected to the central region;
   disposing a chip on the central region of the circuit layer, wherein the chip comprises an active surface at a distance from the circuit layer and a sensing area on the active surface and the conductive connectors surround the chip;
   forming an encapsulant on the circuit layer to encapsulate the chip and the conductive connectors; and
   forming a redistribution layer on the encapsulant, the redistribution layer comprising a dielectric layer and a patterned conductive layer electrically connected to the chip and the conductive connectors, wherein the redistribution layer partially covers the chip and a window of the redistribution layer is a through hole in the dielectric layer of the redistribution layer configured to expose the sensing area of the chip through the redistribution layer; and
   forming a cover layer on the redistribution layer and the sensing area of the chip, wherein a portion of the cover layer is formed within the window of the first redistribution layer and covers the sensing area of the chip, and the cover layer is in physical contact with the sensing area.

2. The manufacturing method of a package structure according to claim 1, wherein the circuit layer comprises a patterned conductive layer, the conductive connectors are formed in the peripheral region of the circuit layer and electrically connected to the patterned conductive layer.

3. The manufacturing method of a package structure according to claim 1, wherein the circuit layer comprises a patterned dielectric layer and a conductive layer formed in the patterned dielectric layer, after forming the conductive connectors on a circuit layer, the conductive connectors are electrically connected to the conductive layer.

4. The manufacturing method of a package structure according to claim 3, wherein the chip comprises a patterned bonding layer on the active surface and surrounding the sensing area, the chip is bonded to the circuit layer using the patterned bonding layer after disposing the chip on the central region of the circuit layer, the patterned bonding layer has a plurality of openings, a portion of the redistribution layer is formed on the patterned bonding layer filling the openings of the patterned bonding layer to partially cover the chip after forming the redistribution layer on the encapsulant.

5. The manufacturing method of a package structure according to claim 1 further comprising:
   reducing a thickness of the encapsulant to expose at least a portion of the conductive connectors before forming the redistribution layer on the encapsulant, wherein at least a portion of the encapsulant is on the active surface of the chip after reducing the thickness of the encapsulant.

6. The manufacturing method of a package structure according to claim 1, wherein the cover layer is formed on the active surface of the chip before disposing the chip on the on the central region of the circuit layer.

7. A manufacturing method of a package structure, comprising:
   encapsulating a chip by an encapsulant, wherein the chip comprises an active surface exposed by the encapsulant and a sensing area on the active surface;
   forming a first redistribution layer on the encapsulant, the first redistribution layer comprising a dielectric layer and a patterned conductive layer electrically connected to the active surface of the chip, wherein a window of the first redistribution layer is a through hole in the dielectric layer of the first redistribution layer configured to expose the sensing area of the chip through the first redistribution layer;
   forming a cover layer on the first redistribution layer and the sensing area of the chip, wherein a portion of the cover layer is formed within the window of the first redistribution layer and covers the sensing area of the chip and the cover layer is in physical contact with the sensing area;
   forming a plurality of vias on the encapsulant to expose at least a portion of the first redistribution layer; and
   forming a plurality of conductive structures on the encapsulant, wherein the conductive structures are electrically connected to the first redistribution layer.

8. The manufacturing method of a package structure according to claim 7, wherein encapsulating the chip by the encapsulant comprises:
   disposing the chip on a carrier;
   forming the encapsulant on the carrier; and
   removing the carrier from the encapsulant to expose the active surface of the chip.

9. The manufacturing method of a package structure according to claim 7 further comprising:

bonding a carrier to a surface of the encapsulant opposite to the active surface of the chip before forming the first redistribution layer on the encapsulant; and removing the carrier from the encapsulant before forming the vias on the encapsulant, wherein after forming the cover layer, the cover layer conformally covers the window of the first redistribution layer.

10. The manufacturing method of a package structure according to claim 7 further comprising:

forming a second redistribution layer on the encapsulant and conformally along an inner surface of the vias before forming the conductive structures on the encapsulant, wherein the second redistribution layer is electrically connected to the first redistribution layer, the conductive structures are formed on the second redistribution layer outside the vias.

11. A package structure, comprising:

a chip, comprising an active surface and a sensing area, wherein the sensing area is disposed on the active surface;

a redistribution layer, disposed on the active surface of the chip and comprising a dielectric layer and a patterned conductive layer electrically connected to the chip, wherein a window of the redistribution layer is a through hole in the dielectric layer of the redistribution layer configured to expose the sensing area of the chip through the redistribution layer;

a cover layer disposed on the redistribution layer and the sensing area of the chip, wherein a portion of the cover layer is formed within the window of the redistribution layer and configured to cover the sensing area of the chip and the cover layer is in physical contact with the sensing area;

a plurality of conductive connectors, surrounding the chip and electrically connected to the redistribution layer; and an encapsulant, encapsulating the chip and the conductive connectors.

12. The package structure according to claim 11, further comprising:

a plurality of conductive structures, disposed on the encapsulant opposite to the redistribution layer, wherein the conductive structures are electrically connected to the redistribution layer through the conductive connectors.

13. The package structure according to claim 11, further comprising:

a circuit layer, disposed on the encapsulant and comprising a central region and a peripheral region electrically connected to the central region, wherein the circuit layer and the redistribution layer disposed on the two opposite sides of the chip, the circuit layer comprises a patterned conductive layer, the conductive connectors are disposed in the peripheral region of the circuit layer and electrically connected to the patterned conductive layer, the chip is disposed on the central region of the circuit layer.

14. The package structure according to claim 13, wherein the circuit layer comprises a patterned dielectric layer and a conductive layer embedded in the patterned dielectric layer, the conductive connectors are electrically connected to the conductive layer.

15. The package structure according to claim 13, further comprising:

a patterned circuit layer, disposed on the encapsulant to electrically connect the conductive connectors, wherein the conductive connectors are connected between the circuit layer and the patterned circuit layer.

16. The package structure according to claim 11, wherein the chip comprises a patterned bonding layer disposed on the active surface and surrounding the sensing area, the chip is connected to the circuit layer through the patterned bonding layer, the patterned bonding layer has a plurality of openings, a portion of the redistribution layer disposed on the patterned bonding layer fills the openings of the patterned bonding layer to partially cover the chip.

17. The package structure according to claim 11, wherein the cover layer conformally covers the window of the redistribution layer.

18. The package structure according to claim 11, wherein the cover layer is disposed between the redistribution layer and the chip.

19. The package structure according to claim 11, wherein at least a portion of the encapsulant is disposed on the active surface of the chip.

20. The package structure according to claim 11, further comprising:

a plurality of vias, penetrating the encapsulant and connected to the redistribution layer, wherein the conductive connectors are disposed in the vias and electrically connected to the redistribution layer; and a plurality the conductive structures, disposed on the encapsulant and outside the vias, wherein the conductive structures are electrically connected to the redistribution layer.

* * * * *